(12) United States Patent
Lu et al.

(10) Patent No.: US 8,679,580 B2
(45) Date of Patent: Mar. 25, 2014

(54) NANOSTRUCTURED COATINGS AND RELATED METHODS

(75) Inventors: Songwei Lu, Wexford, PA (US); Cheri M. Boykin, Wexford, PA (US); Caroline S. Harris, Pittsburgh, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 794 days.

(21) Appl. No.: 11/543,644

(22) Filed: Oct. 5, 2006

(65) Prior Publication Data

US 2007/0087187 A1    Apr. 19, 2007

Related U.S. Application Data

(63) Continuation-in-part of application No. 10/897,847, filed on Jul. 22, 2004, now abandoned, which is a continuation-in-part of application No. 10/623,401, filed on Jul. 18, 2003, now abandoned.

(51) Int. Cl.
*B05D 1/24* (2006.01)
*B05D 1/12* (2006.01)
*B05D 1/36* (2006.01)

(52) U.S. Cl.
USPC ............ 427/182; 427/459; 427/205; 427/226

(58) Field of Classification Search
USPC ..................... 427/182, 205, 226, 459, 206
See application file for complete search history.

(56) References Cited

U.S. PATENT DOCUMENTS

| | | | |
|---|---|---|---|
| 3,660,061 A | 5/1972 | Bach | 260/78 R |
| 4,111,150 A | 9/1978 | Donley et al. | 118/7 |
| 4,379,040 A | 4/1983 | Gillery | 209/464 |
| 4,719,126 A | 1/1988 | Henery | 427/165 |
| 4,719,127 A | 1/1988 | Greenberg | 427/165 |
| 4,853,257 A | 8/1989 | Henery | 427/166 |
| 4,861,669 A | 8/1989 | Gillery | 428/434 |
| 4,900,633 A | 2/1990 | Gillery | 428/432 |
| 4,971,843 A | 11/1990 | Michelotti et al. | 428/34 |
| 5,071,796 A | 12/1991 | Jones et al. | 501/70 |
| 5,352,640 A | 10/1994 | Combes et al. | 501/71 |
| 5,464,657 A | 11/1995 | Athey et al. | 427/255.5 |
| 5,540,959 A * | 7/1996 | Wang | 427/561 |
| 5,545,596 A | 8/1996 | Casariego et al. | 501/71 |
| 5,599,387 A | 2/1997 | Neuman et al. | 106/287.14 |
| 5,688,727 A | 11/1997 | Shelestak et al. | 501/70 |
| 5,780,372 A | 7/1998 | Higby | 1/70 |

(Continued)

FOREIGN PATENT DOCUMENTS

| | | |
|---|---|---|
| DE | 198 02 791 | 7/1999 |
| WO | 00/20346 | 4/2000 |

(Continued)

OTHER PUBLICATIONS

U.S. Appl. No. 11/843,756, filed Aug. 23, 2007.

(Continued)

*Primary Examiner* — Frederick Parker
(74) *Attorney, Agent, or Firm* — Andrew C. Siminerio

(57) ABSTRACT

A coated substrate and methods for making the coated substrate are disclosed. The method entails depositing an undercoating over at least a portion of the substrate; fluidizing a precursor for nanoparticles; and forcing the fluidized precursor toward the substrate to coat the undercoating with a layer of nanoparticles. Coated substrates according to the present invention exhibit improved durability and increased photocatalytic activity.

18 Claims, 1 Drawing Sheet

(56) References Cited

U.S. PATENT DOCUMENTS

| | | |
|---|---|---|
| 5,807,417 A | 9/1998 | Boulos et al. .............. 65/134.3 |
| 5,837,629 A | 11/1998 | Combes et al. .............. 501/70 |
| 5,948,131 A | 9/1999 | Neuman .............. 65/60.2 |
| 6,254,940 B1 * | 7/2001 | Pratsinis et al. .............. 427/562 |
| 6,413,581 B1 * | 7/2002 | Greenberg et al. .............. 427/226 |
| 6,465,088 B1 | 10/2002 | Talpaert et al. .............. 428/307.3 |
| 6,482,374 B1 | 11/2002 | Kumar et al. .............. 423/179.5 |
| 2002/0029955 A1 * | 3/2002 | Sahle-Demessie et al. .............. 204/157.15 |
| 2002/0150681 A1 | 10/2002 | Boire et al. .............. 427/255.36 |
| 2003/0003241 A1 | 1/2003 | Suzuki et al. |
| 2003/0235695 A1 | 12/2003 | Greenberg et al. .............. 428/432 |
| 2004/0043260 A1 * | 3/2004 | Nadaud et al. .............. 428/701 |
| 2004/0058167 A1 | 3/2004 | Arbab et al. |
| 2004/0180220 A1 * | 9/2004 | Gueneau et al. .............. 428/446 |
| 2005/0031876 A1 | 2/2005 | Lu et al. |

FOREIGN PATENT DOCUMENTS

| | | |
|---|---|---|
| WO | 00/44679 | 8/2000 |
| WO | 01/28941 A1 | 4/2001 |
| WO | 02/46112 A1 | 6/2002 |
| WO | 2004/035496 | 4/2004 |
| WO | WO2004/035496 | 4/2004 |
| WO | WO2006/020188 | 2/2006 |

OTHER PUBLICATIONS

U.S. Appl. No. 60/397,486, filed Jul. 19, 2002.

Cembrero J. et al: "Nanocolumnar ZnO films for photovoltaic applications" Preparation and Characterization, Elsevier Sequoia, NL, vol. 451-452, Mar. 22, 2004, pp. 198-202, XP004495093 ISSN: 0040-6090, figure 1.

PCT International Search Report and Written Opinion of the International Searching Authority dated Jun. 3, 2008 corresponding to International Application No. PCT/US2007/080243.

Cembrero, J et al.; "Nanocolumnar ZnO films for photovoltaic applications", Preparation and Characterization, Elsevier Sequoia, NL., vol. 451-202, Mar. 22, 2004, pp. 198-202, XP004495093 ISSN: 0040-6090, figure 1.

* cited by examiner

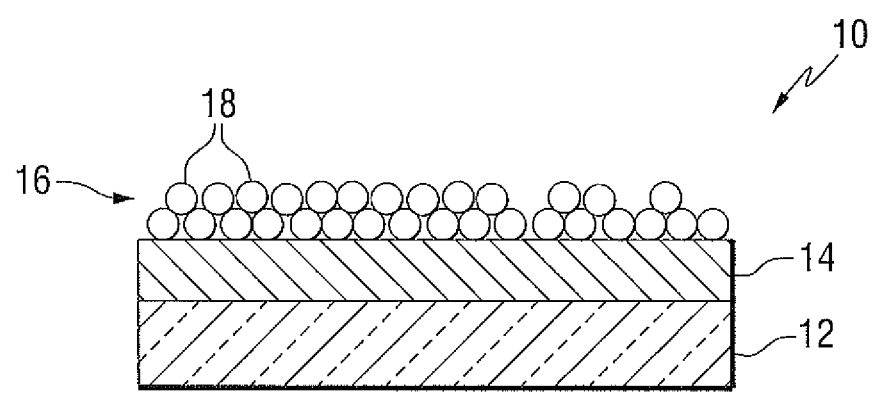

NANOSTRUCTURED COATINGS AND RELATED METHODS

RELATED APPLICATION

The present application is a continuation-in-part of U.S. patent application Ser. No. 10/897,847 filed on Jul. 22, 2004, now abandoned, which is a continuation-in-part of U.S. patent application Ser. No. 10/623,401 filed on Jul. 18, 2003, now abandoned, both of which applications are herein incorporated by reference in their entirety.

FIELD OF THE INVENTION

The present invention relates to coating compositions having photocatalytic properties and related coated articles.

BACKGROUND OF THE INVENTION

Substrates are used in a variety of applications, such as buildings, automobiles, appliances, etc. Oftentimes, the substrates are coated with a functional coating(s) to exhibit the required performance properties. Examples of functional coatings include electroconductive coatings, photocatalytic coatings, thermal management coatings, hydrophilic coatings, etc.

A photocatalytic thin film coating can be applied on a substrate, such as glass, to keep the surface free of common organic surface contaminants. Known photocatalytic thin film coatings include those made of titania ($TiO_2$). When the titania coating is exposed to ultraviolet radiation ("UV"), it exhibits photocatalytic properties. Specifically, the coating absorbs UV photons and, in the presence of water or moisture, generates highly reactive hydroxyl radicals that tend to oxidize organic materials on the coated substrate. Ultimately, any organic material on the surface of the coated substrate gets converted to more volatile, lower molecular weight materials that can be washed away or evaporate away.

Typically, the functional coating is deposited directly on the substrate. In many instances when a functional coating is applied the traditional way, the coated substrate exhibits less than optimal durability and undesirable aesthetic properties. Examples of undesirable aesthetic properties include increased reflectance and/or unwanted color. As a result of undesirable aesthetic properties, it is not practical to deposit many functional coatings at their optimal thickness. For example, it is not practical to deposit a photocatalytic coating at the thickness that produces the greatest photocatalytic activity due to unwanted color or high reflectance.

The present invention provides a coated substrate that includes an undercoating and a functional coating that is applied over the undercoating. The coated substrate according to the present invention can exhibit improved performance properties, such as aesthetic properties, durability, photocatalytic activity, etc.

SUMMARY OF THE INVENTION

In a non-limiting embodiment, the present invention is a substrate coated with a nanoparticle coating formed by a process comprising depositing an undercoating over at least a portion of the substrate; fluidizing a precursor for nanoparticles; and forcing the fluidized precursor toward the substrate to coat the undercoating with nanoparticles.

In another non-limiting embodiment, the present invention is a coated glass substrate formed by depositing an undercoating comprising a mixture of silica and alumina over at least a portion of the substrate; fluidizing a precursor for titania nanoparticles selected from titanium(IV)isopropoxide, titanium(IV)chloride, titanium(IV)butoxide, titanium(IV)ethoxide, titanium(IV)methoxide, titanium(IV)oxideacetylacetonate, titanium(IV)propoxide and titanium(IV)(triethanolaminato)isopropoxide; and forcing the fluidized precursor toward the substrate to coat the undercoating with nanoparticles.

In yet another non-limiting embodiment, the present invention is a method of making a coated substrate comprising depositing an undercoating over at least a portion of the substrate; fluidizing a precursor for nanoparticles; and forcing the fluidized precursor toward the substrate to coat the undercoating with nanoparticles.

In a further non-limiting embodiment, the present invention is a method of making a coated substrate comprising depositing an undercoating comprising a mixture of titania and alumina; or silica and alumina; or silica and titania, or silica and titania and alumina over at least a portion of the substrate; fluidizing a precursor for titania nanoparticles selected from titanium(IV)isopropoxide, titanium(IV)chloride, titanium(IV)butoxide, titanium(IV)ethoxide, titanium(IV)methoxide, titanium(IV)oxideacetylacetonate, titanium(IV)propoxide and titanium(IV)(triethanolaminato)isopropoxide; and forcing the fluidized precursor toward the substrate using compressed air to coat the undercoating with nanoparticles.

BRIEF DESCRIPTION OF THE DRAWING

FIG. 1 is a side, sectional view (not to scale) of a coated article of the invention.

DESCRIPTION OF THE INVENTION

All numbers expressing dimensions, physical characteristics, quantities of ingredients, reaction conditions, and the like used in the specification and claims are to be understood as being modified in all instances by the term "about". Accordingly, unless indicated to the contrary, the numerical values set forth in the following specification and claims may vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques. Moreover, all ranges disclosed herein are to be understood to encompass any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 1 to 7.8, 3 to 4.5, 6.3 to 10.

As used herein, the terms "on", "applied on/over", "formed on/over", "deposited on/over", "overlay" and "provided on/over" mean formed, deposited, or provided on but not necessarily in contact with the surface. For example, a coating layer "formed over" a substrate does not preclude the presence of one or more other coating layers of the same or different composition located between the formed coating layer and the substrate. For instance, the substrate can include a conventional coating such as those known in the art for coating substrates, such as glass or ceramic.

As used herein, "nanoparticles" refers to a three dimensional particles having a size, e.g. diameter or length, in the range of 1 nanometer (nm) to 500 nm, such as 1 nm to 200 nm, such as 1 nm to 100 nm, such as 1 nm to 50 nm, such as 30 nm to 50 nm.

An exemplary coated article 10 of the invention is shown in FIG. 1. The article 10 includes a substrate 12, an optional undercoating 14, and a functional coating 16. In the illustrated embodiment, the functional coating is a nanoparticle coating formed by one or more layers of nanoparticles 18.

In a non-limiting embodiment, the present invention is a coated substrate comprising a substrate; an optional undercoating over the substrate; and a functional coating over the undercoating. Suitable substrates for the present invention include, but are not limited to, polymers, ceramics and glass. The substrate can be glass; especially window glass made by the float process. The glass can be of any type, such as conventional float glass or flat glass, and can be of any composition having any optical properties, e.g., any value of visible transmission, ultraviolet transmission, infrared transmission, and/or total solar energy transmission. Examples of suitable glass include borosilicate glass and soda-lime-silica glass compositions, which are well known in the art. Exemplary glass compositions are disclosed in, but are not limited to, U.S. Pat. Nos. 5,071,796; 5,837,629; 5,688,727; 5,545,596; 5,780,372; 5,352,640; and 5,807,417.

Suitable ceramic substrates include oxides such as alumina, zirconia, and clay and non-oxides such as silicon carbide, alumina nitride, etc.

Suitable polymers include polymethylmethacrylate, polycarbonate, polyurethane, polyvinylbutyral (PVB) polyethyleneterephthalate (PET), or copolymers of any monomers for preparing these, or mixtures thereof.

The optional undercoating can overlay at least a portion of the substrate and can comprise a single layer of coating or multiple layers of coating. The undercoating can be a conventional non-porous, thin film coating. In a non-limiting embodiment of the invention, the undercoating is a single layer of coating comprised of one or more of the following materials: tin oxide, silica, titania, alumina, zirconia, zinc oxide, cesium oxide, and alloys and mixtures (e.g., binary, ternary, etc.) thereof.

In another non-limiting embodiment of the invention, the undercoating is a single layer comprised of a mixture of titania and silica; silica and tin oxide; alumina and tin oxide; alumina and zirconia; alumina and zinc oxide; silica and zirconia; silica and zinc oxide; alumina and silica; titania and alumina; or alumina, titania and silica. Mixtures of the described materials can be made according to methods that are well known in the art. Suitable mixtures comprise every combination of ranges for the aforementioned materials including ternary and quaternary combinations. The exact composition of the mixture will depend on the required properties of the undercoating such as the deposition properties, film durability, aesthetic properties, crystallinity, etc.

When the undercoating is comprised of a mixture of materials, the composition of the undercoating can be homogeneous throughout, vary randomly throughout the layer, or have a graded progression. For example, the undercoating can be made of a mixture of two materials, a first material and a second material, and can have a composition that varies in a graded progression between interfaces such as, for example, a substrate and a functional coating. The composition of the undercoating adjacent to the substrate can be composed primarily of or exclusively of the first material and as the distance from the substrate increases, the concentration of the first material in the undercoating decreases and the concentration of the second material in the undercoating increases. At a certain distance from the substrate, the composition of the undercoating can be predominantly or exclusively comprised of the second material.

In one non-limiting embodiment of the invention, the change in the concentrations of the materials is linear.

In yet another non-limiting embodiment of the invention, the undercoating has a multi-layer configuration. The individual layers of the multilayered coating can be homogenous or graded or a combination of materials as discussed above with respect to the single layer undercoating.

The undercoating of the present invention can be applied using conventional application techniques such as chemical vapor deposition ("CVD"), spray pyrolysis, and magnetron sputtered vacuum deposition ("MSVD") as are well known in the thin film art.

Suitable CVD methods of deposition are described in the following references, which are hereby incorporated by reference: U.S. Pat. Nos. 4,853,257; 4,971,843; 5,464,657; 5,599,387; and 5,948,131.

Suitable spray pyrolysis methods of deposition are described in the following references, which are hereby incorporated by reference: U.S. Pat. Nos. 4,719,126; 4,719,127; 4,111,150; and 3,660,061.

Suitable MSVD methods of deposition are described in the following references, which are hereby incorporated by reference: U.S. Pat. Nos. 4,379,040; 4,861,669; and 4,900,633.

The undercoating of the present invention can be any thickness. For example, the thickness of the undercoating can be at least 10 nm, such as from 10 nm to 1,000 nm, such as from 10 nm to 500 nm, such as from 10 nm for 100 nm. The exact thickness of undercoating is determined by the functional coating that overlays the undercoating as well as the end use of the coated substrate.

According to the present invention, a functional coating overlays at least a portion of the undercoating. The functional coating can be any type known in the art. The functional coating can be a single layer coating or a multiple layer coating. As used herein, the term "functional coating" refers to a coating that modifies one or more physical properties of the substrate over which it is deposited, e.g., optical, thermal, chemical or mechanical properties, and is not intended to be entirely removed from the substrate during subsequent processing. The functional coating can have one or more layers of coating having the same or different composition or functionality.

In a non-limiting embodiment of the invention, the functional coating can be a photocatalytic coating like the one described in U.S. Pat. No. 6,413,581, which is hereby incorporated by reference. As mentioned previously, a photocatalytic coating can be applied on a substrate so that the substrate can be cleaned relatively easily and/or infrequently. The photocatalytic coating can be comprised of any material that can be activated using radiation to have catalytic activity. Examples of suitable photocatalytic coatings include, but are not limited to, one or more metal oxides. A non-limiting list of suitable metal oxides includes titanium oxides, iron oxides, copper oxides, tungsten oxides, mixtures of zinc oxides and tin oxides, strontium titanate, and mixtures or combinations thereof. The metal oxide(s) can include super-oxides or sub-oxides of the metal. Titania in its various crystal forms such as anatase or rutile forms can be used in the photocatalytic coating.

The photocatalytic coating can be activated using radiation in the ultraviolet range, e.g. 300-400 nm of the electromagnetic spectrum. Suitable sources of ultraviolet radiation include natural sources like solar radiation and artificial sources like black light or an ultraviolet light source.

According to the present invention, the functional coating can be applied over the undercoating using any of the conventional methods described above in reference to the undercoating. One skilled in the art knows which application techniques can be used based on the type of functional coating and undercoating contained in the embodiment. The functional coating can be any thickness.

In another non-limiting embodiment, the functional coating comprises one or more layers of nanoparticles (i.e., the nanoparticles make up a coating), for example titania nanoparticles. The nanoparticles can have any desired shapes: such as but not limited to spherical, polyhedral-like cubic, triangular, pentagonal, diamond-shaped, needle-shaped, rod-shaped, disc-shaped, etc. The nanoparticles can have an aspect ratio ranging from 1:1 to 1:1,000, e.g., 1:1 to 1:100. The nanoparticles can have a degree and orientation of crystallinity ranging from completely amorphous (0 percent crystallinity) to fully oriented along one crystal orientation. For example, if the nanoparticles are titania nanoparticles, the titania nanoparticles can be in the anatase, or rutile, or brookite phase or a mixture of two or more of these phases. The nanoparticles can be in contact with each other or separated by a distance, such as but not limited to a distance in the range of 1 nm to 1000 nm, such as 1 nm to 500 nm, such as 1 nm to 50 nm. In one embodiment, the longest dimension of the titania nanoparticles can range from 1 nm to 500 nm, for example from 1 nm to 200 nm, such as 30 nm to 50 nm. Thus, in the present invention, the nanoparticles can be in a single layer or multiple layers. The individual nanoparticles can be applied onto the substrate to form a porous coating resembling one or more layers of billiard balls, with open areas or passages defined between the adjacent particles.

The nanoparticles can be applied over the undercoating in various ways. In a non-limiting embodiment of the invention, the nanoparticles are applied over the undercoating in the following manner. The first step in the present invention involves fluidizing a precursor for the nanoparticles. The specific precursor utilized will depend on the desired nanostructure.

In a non-limiting embodiment where the layer of nanoparticles will be comprised of titania nanoparticles, the following precursors for the titania nanoparticles can be used: titanium(IV)isopropoxide, titanium(IV)chloride, titanium(IV)butoxide, titanium(IV)ethoxide, titanium(IV)methoxide, titanium(IV)oxideacetylacetonate, titanium(IV)propoxide and titanium(IV)(triethanolaminato)isopropoxide. For example, a precursor solution can comprise 0.1-50.0 weight percent of titanium(IV)isopropoxide, such as 1 to 30 weight percent, such as up to 25 weight percent, such as 2 to 10 wieght percent, such as 5 to 8 weight percent dissolved in alcohol, such as ethanol. A titanium stabilizer, such as 2,4-pentanedione, can be added to the solution. One or more doping ions, such as but not limited to $Ag^+$, $Sn^{+2}$, $Sn^{+4}$, $W^{+3}$, $Au^{+3}$, $V^{+4}$, $Fe^{+3}$, $F^-$, and the like, can be added to the precursor solution.

In other non-limiting embodiments of the invention, layers of other nanoparticles, such as antimony tin oxide and indium tin oxide, can be deposited. Precursors for the stated nanoparticles are well known in the art.

Prior to fluidization, the temperature of the starting material can be maintained at a temperature that allows sufficient sublimation or vaporization from a solid or a liquid starting material or at a temperature at which the starting material has a sufficiently low viscosity for atomization. In a non-limiting embodiment, the temperature of the starting material can be greater than or equal to room temperature. In another embodiment, the temperature can be less than room temperature.

The precursor for the nanoparticles can be fluidized in any manner known in the art, including but not limited to atomizing the starting material into an aerosol; evaporating the starting material into a gas phase; subliming the starting material into a gas phase, or other similar techniques. For example, in a non-limiting embodiment, the precursor can be fluidized using a commercially available atomizer, such as Model 9306 from TSI, Inc. (Shoreview, Minn.) to make an aerosol.

The fluidized material is forced toward the surface of the article. In a non-limiting embodiment, the fluidized material can be forced by imparting momentum to the fluidized materials using a moving gas stream. For example, compressed air, compressed nitrogen, etc. can be used to direct the fluidized material toward the surface of the article. Also, a gravitational field, a thermophoretic field, an electrostatic field, or similar can also be used to force the fluidized material toward the surface of the article.

In many instances, the nanoparticles will form when the fluidized material impacts the surface of the undercoating. Such is especially likely to occur if the temperature of the surface of the undercoating ranges from 25° F. to 3000° F. (−4° C. to 1649° C.), such as 400° C. to 900° C., such as 600° C. to 750° C.

Sometimes, it will be necessary to perform a third step to form the layer of nanoparticles on the surface of the undercoating. The third step involves passing the fluidized material through a high energy zone, i.e., a zone that will facilitate the formation of nanoparticles. The manner in which the high energy facilitates the formation depends on the type of high energy zone used as discussed below. The passing step can be accomplished in any conventional manner, such as by supplying an additional force or pressure to the fluidized material. The passing step can occur (a) before the forcing step; (b) after the forcing step but before the fluidizing material comes in contact with the surface of the substrate; (c) during the forcing step; or (d) after the forcing step and after the fluidized material comes in contact with the surface of the substrate. In the high energy zone, the fluidized material can be excited using heat, electromagnetic radiation, high voltage or similar means to cause the fluidized material to lose volatiles, condense, chemically react, decompose, change phase or a combination thereof.

Examples of suitable high energy zones include, but are not limited to, hot wall reactors, chemical vapor particle deposition reactors ("CVPD"), combustion deposition reactors, plasma chambers, laser beams, microwave chambers, etc.

In a non-limiting embodiment, a hot wall reactor is the high energy zone. The hot wall reactor is essentially a heated chamber. Starting material can be delivered to the hot wall reactor by a spray system such as a forced aerosol generator. Inside the reactor, the fluidized material can lose volatiles, condense, chemically react, decompose, change phase or a combination thereof.

Without limiting the invention, the following describes some of the typical parameters for the operation of the hot wall reactor in the present invention. Typically, the temperature inside the hot wall reactor ranges from 300° F. to 2,100° F. (149° C. to 1,149° C.), for example, 900° F. to 1,650° F. (482° C. to 899° C.) or 1,100° F. to 1,400° F. (593° C. to 760° C.). The pressure inside the reactor can be ambient or can be independently controlled. The atmosphere inside the reactor can be nitrogen, air, or a mixture of 2 to 5 percent by volume hydrogen and 98 to 95 percent by volume nitrogen. The residence time (time the material is in the reactor) in the reactor has to be sufficient to enable the requisite processing in the high energy zone to occur.

In another non-limiting embodiment, a CVPD reactor is the high energy zone. The CVPD is essentially a heated chamber. In a CVPD process, starting material can be evaporated to a gas phase as in a conventional chemical vapor deposition system. The gas phase is then forced through the CVPD reactor, for example, as a result of a pressure gradient. Inside the reactor, the fluidized material loses volatiles, condenses, chemically reacts, decomposes, changes phases or a combination thereof.

Without limiting the invention, the following describes some typical parameters for CVPD reactor operation in the present invention. Typically, the temperature inside the CVPD can range from 300° F. to 2,100° F. (149° C. to 1,1490° C.), for example, 900° F. to 1,650° F. (482° C. to 899° C.) or 1,100° F. to 1,400° F. (593° C. to 760° C.). The pressure inside the reactor can be ambient or can be independently controlled. The atmosphere inside the reactor can be nitrogen, air, or a mixture of 2 to 5 percent by volume hydrogen and 98 to 95 percent by volume nitrogen. The residence time in the reactor has to be sufficient to enable the requisite processing in the high energy zone to occur.

In yet another non-limiting embodiment, a combustion deposition reactor is the high energy zone. In a combustion deposition reactor, starting material can be atomized, for example, by an aerosol generator to form an aerosol steam. The aerosol can be introduced into a flame in the reactor at any location within the flame. At different locations along the flame, the temperature of the flame is different, the chemical make-up of the flame is different, etc.

In the alternative, the aerosol can be mixed in with the gaseous mixture, e.g., air or oxygen or gas, responsible for the flame. The mixture that makes the flame can be a mixture of a combustible material and an oxidizing material, such as air and natural gas, oxygen and natural gas, or carbon monoxide and oxygen.

The temperature range of the flame typically can range from 212° F. to 2,900° F. (100° C. to 1,593° C.), for example, or 400° F. to 2,300° F. (204° C. to 1,260° C.). The residence time (time the material is in the flame) has to be sufficient to enable the requisite processing in the high energy zone to occur.

In another non-limiting embodiment, a plasma chamber is the high energy zone. In the plasma chamber, the fluidized material is forced through a gas discharge, for example an atmospheric or low pressure plasma, and is energized through collision with electrons or ions that constitute the plasma. The plasma can comprise a reactive gas like oxygen, an inert gas like argon, or a mixture of gases. For example, the plasma chamber can be a stainless steel chamber in which a gaseous phase is excited to form a plasma.

The pressure in the plasma chamber can range from 10 mtorr to 760 torr. The residence time in the plasma chamber has to be sufficient to enable the requisite processing in the high energy zone to occur.

In a further non-limiting embodiment, a laser beam is the high energy zone. The fluidized material can pass through the laser beam and absorb photons. A suitable laser includes, but is not limited to, a $CO_2$ laser with a wavelength of 10,600 nm. See U.S. Pat. No. 6,482,374, which is hereby incorporated by reference, for an example of a suitable laser.

In various non-limiting embodiments of the invention, additional coating layers can be formed over the layer of nanoparticles. For example, a conventional titania coating can be formed over a layer of titania nanoparticles.

The process of the present invention can comprise optional steps such as steps related to heating and/or cooling the substrate. For example, the substrate can be heated to bend or temper the final article. Heating processes for bending or tempering can serve as a high energy zone as described above. Also, the substrate can be controllably cooled to produce annealed glass as is well known in the art.

In a non-limiting embodiment, the present invention is part of an on-line production system. For example, the process of the present invention can be part of a float glass operation where the process is performed at or near the hot end of a conventional float bath. The invention is not limited to use with the float process. For example, the invention can be used in a vertical draw process.

The coated substrate of the present invention demonstrates improved performance properties, such as durability, photocatalytic activity, and aesthetic properties. The nanoparticle coating provides an increased surface area for photocatalytic activity compared to conventional thin film coatings. Some of the improved performance stems from the undercoating serving as a barrier layer to prevent mobile ions in the substrate from migrating to the surface and negatively interacting with the functional coating. In a non-limiting embodiment of the invention, an undercoating that is a barrier layer to sodium ions overlays at least a portion of a glass substrate (sodium ions are mobile in glass) and a functional coating comprising a photocatalytic coating, such as a titania coating, overlays at least a portion of the undercoating. Such a coated substrate can exhibit increased durability and increased photocatalytic activity because the alkali ions are prevented from migrating to the functional coating.

EXAMPLES

The present invention will now be illustrated by the following, non-limiting examples. Samples 1-4 were prepared in the following manner: A precursor solution for titania nanoparticles comprised titanium(IV)isopropoxide dissolved in ethanol. A stabilizer, 2,4-pentanedione, was added and the precursor solution was 8 wt % titanium(IV)isopropoxide in solution.

The precursor solution was atomized using a standard aerosol generator. The aerosol was then forced using compressed air directly onto a 3.0 mm thick clear float glass substrate without an undercoating. The temperature of the glass was 1,200° F. (649° C.). The estimated average dimension of the nanoparticles formed was 50 nm. The longest dimensions of the nanoparticles formed ranged from 5 nm to 100 nm. The estimated density of the nanoparticles formed was 2.96 g/cm$^3$.

Samples 5-8 were prepared in the same manner as above except the clear glass substrate was coated with a 54.1 nm thick undercoating prior to undergoing the process in which the layer of titania nanoparticles was applied. The undercoating comprised a mixture of 85% silica and 15% alumina based on molar percentage and was applied over the substrate using standard magnetron sputtering vacuum deposition (MSVD) techniques.

Table 1 shows the durability performance of coated substrates according to the present invention. The test was conducted in the following manner: The samples were placed in a Cleveland Condensation Chamber (the chamber was at 140° F. at 100% humidity) and the change in reflected color ΔE (MacAdam Units (FMC II dE)) was measured and recorded every week for a period of 10 weeks. If the ΔE was larger than 4 MacAdam Units, the sample was deemed to fail the durability test. A substrate had to exhibit a ΔE of less than 4 MacAdam Units for ten weeks to pass the durability test. The MacAdam Unit (FMC II dE) is a universally adopted color matching system.

TABLE 1

Results of the Durability Test

| | Sample 1 | Sample 2 | Sample 3 | Sample 4 | Sample 5 | Sample 6 | Sample 7 | Sample 8 |
|---|---|---|---|---|---|---|---|---|
| Week 1 | 28.61 | 3.07 | 1.94 | 4.44 | 0.72 | 0.78 | 1.61 | 0.87 |
| Week 2 | Failed | 22.62 | 19.31 | 31.71 | 0.61 | 0.68 | 1.48 | 0.67 |
| Week 3 | | Failed | Failed | Failed | 2.35 | 2.84 | 0.7 | 1.89 |
| Week 4 | | | | | 1.53 | 1.04 | 0.49 | 0.68 |
| Week 5 | | | | | 0.64 | 0.76 | 1.58 | 0.56 |
| Week 6 | | | | | 0.56 | 1.14 | 1.1 | 0.28 |
| Week 7 | | | | | 0.75 | 0.46 | 2.09 | 1.38 |
| Week 8 | | | | | 0.76 | 0.38 | 1.59 | 1.28 |
| Week 9 | | | | | 0.65 | 0.14 | 2.13 | 1.28 |
| Week 10 | | | | | 0.41 | 0.18 | 1.63 | 0.99 |

Table 2 shows the photocatalytic activity of coated substrates according to the present invention. Pairs of samples (one with an undercoating and one without) were prepared in the manner described above, with each of the pairs having a layer of titania nanoparticles with different titania amounts per square centimeter as measured by XRF.

The photocatalytic activity (PCA) was determined using the stearic acid test described below. The coated substrates of the examples were coated with a stearic acid test film to measure its photocatalytic activity. A stearic acid/methanol solution having a concentration of about $6 \times 10^{-3}$ moles of stearic acid per liter of solution was applied by pipetting the stearic acid solution at a rate of about 2 ml/10 seconds over the center of the substrate, while the substrate was spinning at a rate of about 1000 revolutions per minute. The stearic acid flowed across the surface of the substrate by centrifugal force to provide a stearic acid film of generally uniform thickness on the surface of the substrate of about 200 Angstroms (Å) in thickness. The thickness of the stearic acid layer was not constant along the length of the substrate but was thickest at the ends of the substrate and thinnest at the center of the substrate due to the applied centrifugal force.

After receiving a coating of stearic acid, the substrates were exposed to ultraviolet radiation from a UVA 340 nm light source normal to coating side of the substrate providing an intensity of about 24 watts per square meter (W/m$^2$) at the surface of the substrate for approximately 60 minutes to induce photocatalytically-activated self-cleaning of the stearic acid test film. Periodic FTIR spectrophotometer measurements were made over the cumulated 60 minute ultraviolet light exposure period using an FTIR spectrophotometer equipped with an MCT detector to quantitatively measure the stripping rate of the stearic acid. More particularly, the coated substrates were exposed to ultraviolet radiation for a measured period of time, after which the substrates were placed in the FTIR spectrophotometer where the integrated area under the C—H absorption band of stearic acid was measured. The substrates were again exposed to ultraviolet radiation for an additional measured period of time to remove additional stearic acid, after which another FTIR measurement was made. This process was repeated, and a plot of the integrated IR absorption intensity of the C—H stretching vibrations versus cumulated time of exposure to ultraviolet light was obtained, the slope of which provided a measure of the photocatalytic activity for the coated substrates. The greater the slope, the greater the photocatalytic activity of the coating. The amount of titania nanoparticles are in units of micrograms per square centimeter (μg cm$^{-2}$).

TABLE 2

Results for Photocatalytic Activity

| Amount of the Titania nanoparticles (μg · cm$^{-2}$) | Without an undercoating PCA ($\times 10^{-3}$ min$^{-1}$ · cm$^{-1}$) | With an undercoating PCA ($\times 10^{-3}$ min$^{-1}$ · cm$^{-1}$) |
|---|---|---|
| 6.0 | 2.6 | 33 |
| 8.1 | 8.7 | 48 |
| 11.0 | 24 | 59 |
| 12.5 | 25.1 | 95.8 |

Conclusion

The present invention provides coated substrates with improved durability and photocatalytic activity. As shown in Table 1, only the substrates according to the present invention having an undercoating were able to pass the durability test. All of the samples that did not contain an undercoating failed in less than three weeks.

As shown in Table 2, substrates according to the present invention exhibit improved photocatalytic activity. A coated substrate according to the present invention with an undercoating that is at least 54 nm thick and nanoparticles having an amount of titania of at least 6 μg·cm$^{-2}$ has a PCA of at least $33 \times 10^{-3}$ min$^{-1}$·cm$^{-1}$. Depending on the amount of the titania per square centimeter, coated substrates according to the present invention showed photocatalytic activity values ranging from $33 \times 10^{-3}$ min$^{-1}$·cm$^{-1}$ to $96 \times 10^{-3}$ min$^{-1}$·cm$^{-1}$. Coated substrates that were not produced in accordance with the present invention showed considerably lower photocatalytic activity. The photocatalytic activity of those substrates ranged from $2.6 \times 10^{-3}$ min$^{-1}$·cm$^{-1}$ to $25 \times 10^{-3}$ min$^{-1}$·cm$^{-1}$.

It will be readily appreciated by those skilled in the art that modifications may be made to the invention without departing from the concepts disclosed in the foregoing description. Such modifications are to be considered as included within the scope of the invention. Accordingly, the particular embodiments described in detail above are illustrative only and are not limiting as to the scope of the invention, which is to be given the full breadth of the appended claims and any and all equivalents thereof.

We claim:

1. A method of making a coated article, comprising:
   a. depositing an undercoating over at least a portion of a substrate;
   b. fluidizing a precursor for nanoparticles; and
   forcing the fluidized precursor toward the substrate to coat the undercoating with nanoparticles, wherein the method produces a coated article having a photocatalytic activity of at least $33\times10^{-3}$ min$^{-1}\cdot$cm$^{-1}$ wherein the undercoating is at least 54 nm thick and the nanoparticles comprise titania in an amount of at least 6 μg·cm$^{-2}$.

2. The method according to claim 1, further comprising passing the fluidized precursor through a high energy zone.

3. The method according to claim 2, wherein the high energy zone is selected from the group consisting of a hot wall reactor, a chemical vapor particle deposition reactor, a combustion deposition reactor, a plasma chamber, a laser beam, and a microwave chamber.

4. The method according to claim 1, wherein the fluidizing step comprises atomizing the precursor into an aerosol.

5. The method according to claim 1, wherein the fluidizing step comprises fluidizing a precursor for the titania nanoparticles selected from the group consisting of titanium(IV)isopropoxide, titanium(IV)chloride, titanium(IV)butoxide, titanium(IV)ethoxide, titanium(IV)methoxide, titanium(IV) oxideacetylacetonate, titanium(IV)propoxide, and titanium (IV)(triethanolaminato)isopropoxide, or mixtures thereof.

6. The method according to claim 1, wherein the forcing step comprises imparting momentum to the fluidized precursor using a moving gas stream.

7. The method according to claim 1, wherein the deposited undercoating comprises a single layer.

8. The method according to claim 7, wherein the deposited undercoating is selected from the group consisting of tin oxide, silica, titania, alumina, zirconia, zinc oxide, cesium oxide, and alloys and mixtures thereof.

9. The method according to claim 7, wherein the deposited undercoating comprises a mixture selected from the group consisting of titania and silica; silica and tin oxide; alumina and tin oxide; alumina and zirconia; alumina and zinc oxide; silica and zirconia; silica and zinc oxide; alumina and silica; titania and alumina; and alumina, silica and titania.

10. The method according to claim 1, wherein the deposited undercoating comprises multiple layers of oxide materials.

11. The method according to claim 10, wherein the deposited undercoating comprises a layer of silica over a layer of tin oxide.

12. The method according to claim 1, wherein the nanoparticles have an aspect ratio ranging from 1:1 to 1:1,000.

13. The method according to claim 1, wherein the nanoparticles are forced onto the undercoating such that they are separated by a distance ranging from 1 nm to 1000 nm.

14. The method according to claim 1, wherein the nanoparticles have a longest dimension ranging from 30 nm to 50 nm.

15. The method according to claim 9, wherein the silica is present in an amount of 85% and the alumina is present in the amount of 15%.

16. The method of claim 1 further comprising forming at least one additional coating layer over the nanoparticle coating.

17. The method of claim 16, wherein said additional coating layer comprises titania.

18. A method of making a coated article, comprising:
a. depositing an undercoating over at least a portion of a glass substrate by chemical vapor deposition;
b. fluidizing a precursor for nanoparticles; and
c. forcing the fluidized precursor toward the substrate to coat the undercoating with nanoparticles thereby forming a layer of nanoparticles on the undercoating;
wherein the method is an online process, and
wherein said nanoparticles comprise titania in brookite phase.

* * * * *